US012765319B2

(12) United States Patent
Chroneos, Jr.

(10) Patent No.: US 12,765,319 B2
(45) Date of Patent: Oct. 13, 2026

(54) ENHANCED ELECTROSTATIC WAFER CHUCK DESIGNS

(71) Applicant: Intel Corporation, Santa Clara, CA (US)

(72) Inventor: Robert Chroneos, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 508 days.

(21) Appl. No.: 18/090,394

(22) Filed: Dec. 28, 2022

(65) Prior Publication Data

US 2024/0222178 A1 Jul. 4, 2024

(51) Int. Cl.

| | |
|---|---|
| ***H10P 72/72*** | (2026.01) |
| ***H10P 72/00*** | (2026.01) |
| ***H10P 72/76*** | (2026.01) |

(52) U.S. Cl.

CPC ........ *H10P 72/722* (2026.01); *H10P 72/0432* (2026.01); *H10P 72/7624* (2026.01)

(58) Field of Classification Search

CPC ........................... H10P 72/722; H10P 72/7624

See application file for complete search history.

(56) References Cited

U.S. PATENT DOCUMENTS

| | | | | |
|---|---|---|---|---|
| 5,584,971 A * | 12/1996 | Komino | C23C 16/463 | 118/724 |
| 5,709,757 A * | 1/1998 | Hatano | C23C 16/4405 | 134/22.12 |
| 2009/0274590 A1* | 11/2009 | Willwerth | H01L 21/68792 | 422/186.04 |
| 2011/0229837 A1* | 9/2011 | Migita | H01L 21/6831 | 156/60 |

* cited by examiner

*Primary Examiner* — Scott Bauer

(74) *Attorney, Agent, or Firm* — Gray Ice Higdon, PLLC

(57) ABSTRACT

This disclosure describes electrostatic wafer chuck designs for holding and heating semiconductor wafers. An electrostatic wafer chuck may include a metal base; a temperature sensor; and a multi-layer ceramic plate including: a bonding layer; a heater; a first dielectric positioned between the heater and the bonding layer; an electrode to electrostatically hold a semiconductor wafer; a second dielectric positioned between the heater and the electrode; a heat spreader to uniformly distribute heat from the heater to the semiconductor wafer; and a third dielectric positioned between the electrode and the semiconductor wafer; and a temperature sensor may extend through the metal base and at least partially through the multi-layer ceramic plate.

17 Claims, 10 Drawing Sheets

ENHANCED ELECTROSTATIC WAFER CHUCK DESIGNS

TECHNICAL FIELD

This disclosure generally relates to devices and systems for electrostatic wafer chucks.

BACKGROUND

In semiconductor fabrication, electrostatic wafer chucks hold wafers electrostatically and allow heat to pass through the wafers while being held by the electrostatic wafer chucks. A consistent and uniform temperature may be needed for wafer etching, and some existing electrostatic wafer chucks result in inconsistent wafer temperature variation during the heating.

DETAILED DESCRIPTION

Figure 1:
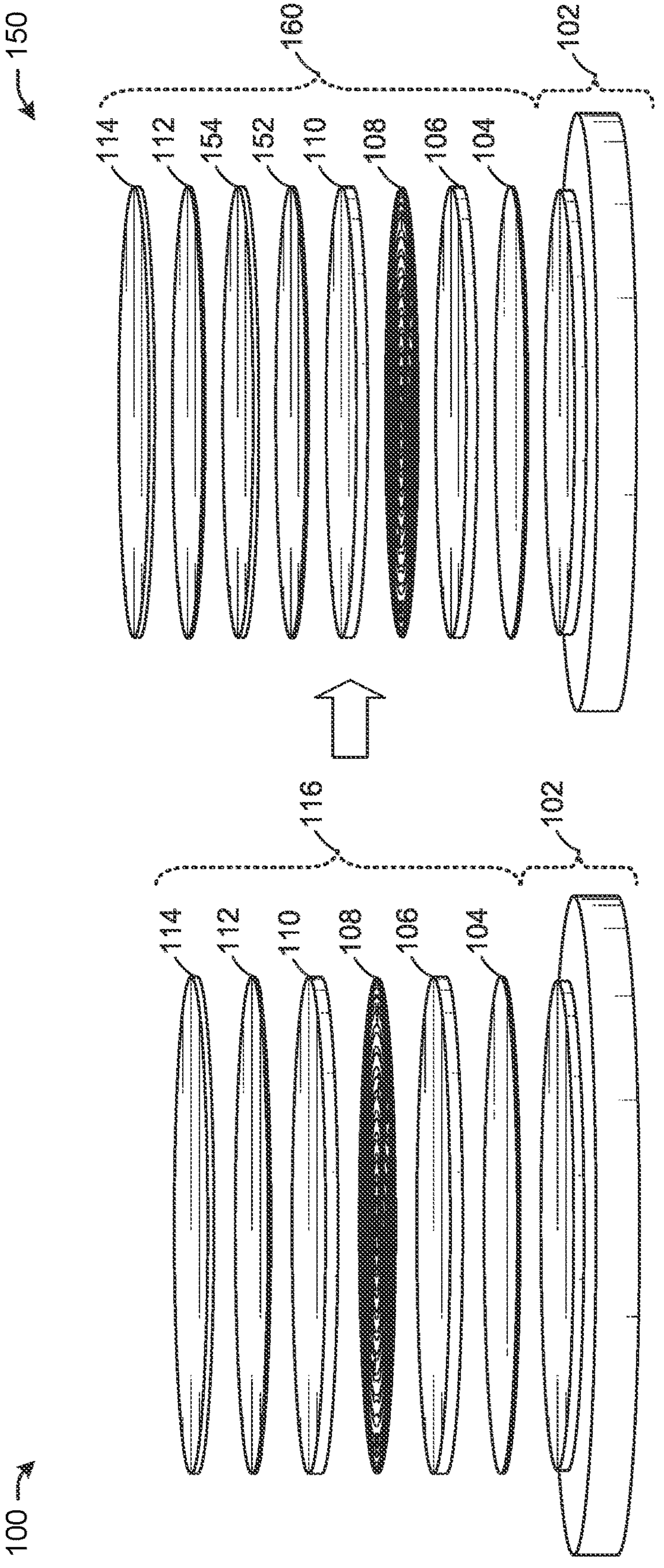
FIG. 1 illustrates example layers of electrostatic wafer chucks, according to some example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

In semiconductor fabrication, electrostatic wafer chucks serve as radiofrequency electrodes and to hold wafers by clamping the wafers electrostatically. While an electrostatic wafer chuck holds a wafer, heat may be applied to the wafer to allow for etching the wafer at a desired temperature.

Wafer temperature uniformity is a critical parameter in manufacturing semiconductor wafers. During processing, wafers are supported and often heated/cooled by various types of wafer holders: e.g., electrostatic chucks, platens, pedestals, susceptors, stages, etc.

One function of the wafer holders is to maintain the wafer surface temperature within a narrow range during processing as temperature variation can affect critical output characteristics of the wafers (e.g., etched pattern dimensions, film thicknesses, and resulting electrical characteristics).

Some existing wafer holders have temperature variations that are proven in many applications to impact good die yields. One function of these wafer holders is to maintain the wafer surface temperature within a certain range during processing as temperature variation and non-uniformity can affect critical output characteristics of those wafers (e.g., etched pattern dimensions, film thicknesses, and electrical characteristics).

Improving wafer surface temperature control will improve process control and process capability and increase product yields in many critical wafer processing operations.

Some existing wafer holders have incorporated heat removal techniques (e.g., flowing heat exchanging liquids through the body of the wafer holder structure to remove heat that results from wafer processing). Temperature is controlled and determined by the heat exchanging liquid (e.g., chiller temperature set-point).

Some wafer holders have incorporated internal heat-generating features (e.g., resistance heater lines, coils) to allow for the wafer holder surface to be adjusted to a desired target temperature and thus the wafer being processed. Some of these internally heated wafer holders have incorporated multiple heaters with independent control to enable adjusting of temperature in select areas of the wafer holder to achieve better temperature uniformity (i.e., multiple heating zones). The number of independent heating zones can be a few as 1 and in some cases over 100 independent heater zones.

Some wafer holders incorporate both internal heat-generating features, and the heat removal techniques mentioned in 1) and 2) above to achieve better overall temperature control.

Some existing versions of temperature control methods rely on a temperature measurement locations that are physically well below the actual wafer surface to provide temperature feedback signals to an active control system to achieve a desired temperature operating setpoint. These temperature measurement locations are physically distant from the actual wafer surface and therefore introduce an offset error in the actual vs the target setpoint temperature depending on the heat flux generated during wafer processing (heat load) and the distance and materials between the wafer and the actual temperature feedback control location. This temperature feedback offset error can also be skewed by other local discontinuities in the structure of the ESC body (e.g. internal heater trace routing patterns, layout keep-away zones and clearances for through holes, heater terminals, cooling channels, etc.) further offsetting the difference between the actual wafer temperature and the temperature control feedback measurement.

In addition, use of an internal liquid cooling requires a channel for the cooling solution to flow in/out of the wafer holder and circulate to/from a separate liquid heat exchanger. This channel has a shape and path that is not uniform itself. This is because the cooling channels must navigate around other structures/features in the wafer holder (e.g., wafer lift pin through holes, backside gas cooling through holes, heater terminal connections, temperature measurement locations). The non-uniform cooling path results in a non-uniform heat removal.

Internal heat generating features also must navigate around the structures/features in the wafer holder causing non-uniformity in the internal heat generation elements and is another source or temperature variation at the ESC surface and at the wafer surface as the wafer is being held during processing.

The trend toward increasing the number of independent heating zones to improve temperature control and surface temperature uniformity adds complexity and cost to the wafer holders and the associated control systems to drive and maintain the independent heaters at the desired operating points. This increased component and system complexity reduces overall system reliability and increases the cost of ownership for the wafer processing tool.

In one or more embodiments, enhanced designs of electrostatic wafer chucks may incorporate a high thermal conductivity heat spreading layer into the structure of an actively heated/cooled electrostatic wafer chuck. An integrated high thermal conductivity heat spreading layer may reduce surface temperature variation caused by physical design non-uniformities and the non-uniform shape/design of the internal heating and cooling elements. Results may include improved wafer process temperature control and increased wafer yields.

In one or more embodiments, the electrostatic wafer chuck internal structure may be designed to provide temperature measurement locations that are closer to the actual wafer surface itself. Allow temperate feedback probes to be located closer to the electrostatic wafer chuck surface, or even provide a direct line of sight for optical temperature measurements of the wafer backside itself.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 illustrates example layers of electrostatic wafer chucks, according to some example embodiments of the present disclosure.

Referring to FIG. 1, an electrostatic wafer chuck 100 may include a liquid cooled metal base 102, a bonding layer 104, a bottom dielectric 106, a heater 108, an inner dielectric 110 separating the heater 108 from an electrode 112, and a top dielectric 114 on the other side of the electrode 112 from the inner dielectric 110. The bonding layer 104, the bottom dielectric 106, the heater 108, the inner dielectric 110, the electrode 112, and the top dielectric 114 may form a multi-layer ceramic plate 116 of the electrostatic wafer chuck 100. The electrode 112 may create an electrostatic force with which to hold a wafer, and the heater 108 may apply heat to the wafer as it is being held.

Still referring to FIG. 1, an electrostatic wafer chuck 150 may include the liquid cooled metal base 102, the bonding layer 104, the bottom dielectric 106, the heater 108, the inner dielectric 110, the electrode 112, and the top dielectric 114 of the electrostatic wafer chuck 100, and also may include a heat spreader 152 and an additional inner dielectric 154. The heat spreader 152 and the additional inner dielectric 154 may be anywhere below the electrode 112 to avoid interference with the electrostatic force if the material of the heat spreader 152 is electrically conductive, but could be above the electrode 112 if electrically not conductive. In this manner, the material choice of the heat spreader 152 is important. The heat spreader 152 is shown as being between the heater 108 and the electrode 112, but could be below the heater 108. The bonding layer 104, the bottom dielectric 106, the heater 108, the inner dielectric 110, the heat spreader 152, the inner dielectric 154, the electrode 112, and the top dielectric 114 may form a multi-layer ceramic plate 160 of the electrostatic wafer chuck 150.

In one or more embodiments, the heat spreader 152 integrated into the multi-layer ceramic plate 160 of the electrostatic wafer chuck 150 may reduce the range of temperature variation at the surface of the electrostatic wafer chuck 150 in contact with a wafer, and therefore at the surface of a chucked wafer being processed. In some embodiments, the heat spreader and the electrode 112 may be a same layer (e.g., the heat spreader 152 as a separate layer may be optional).

Figure 2:
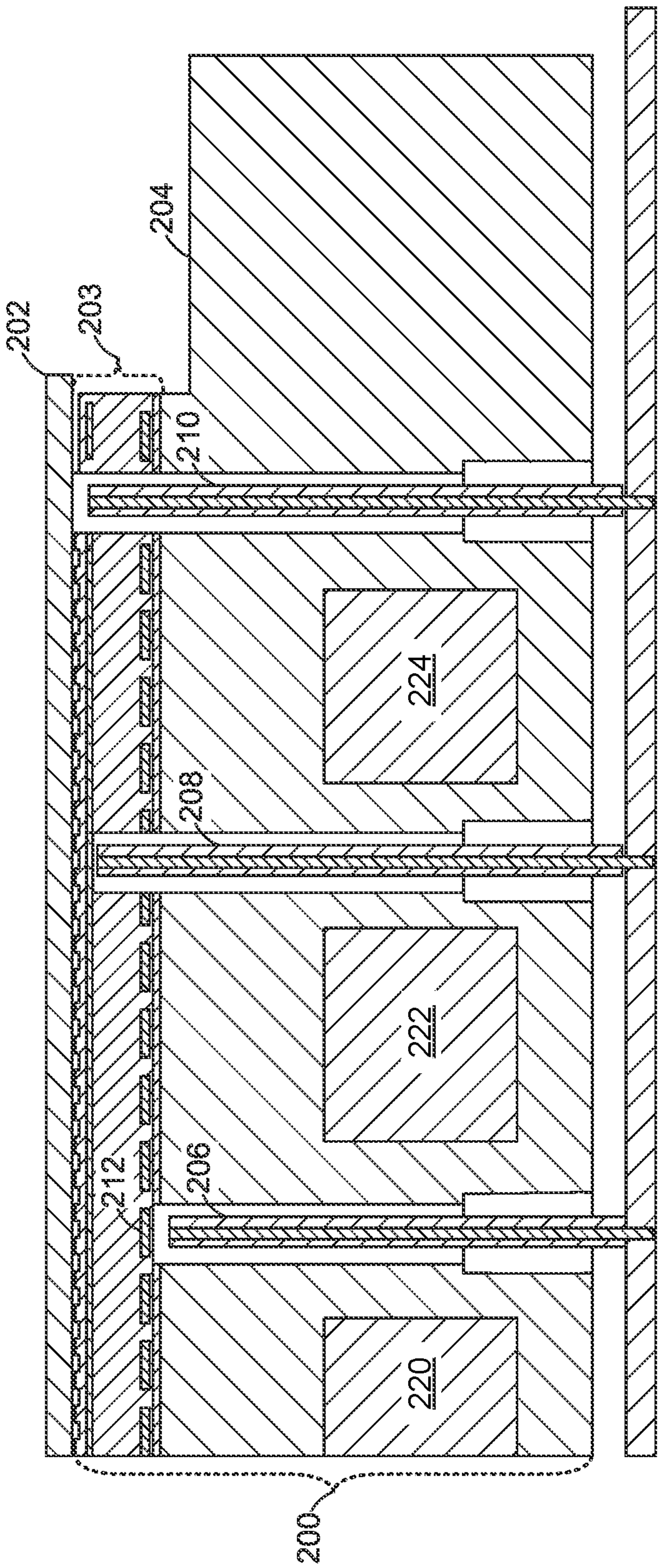
FIG. 2 illustrates example temperature sensing locations for electrostatic wafer chucks, in accordance with one or more example embodiments of the present disclosure.

FIG. 2 illustrates example temperature sensing locations for electrostatic wafer chucks, in accordance with one or more example embodiments of the present disclosure.

Referring to FIG. 2, a cross-section of an electrostatic wafer chuck 200 (e.g., representative of the electrostatic wafer chuck 150 of FIG. 1) is shown. A wafer 202 may be held by the electrostatic wafer chuck 200 (e.g., by a multi-layer ceramic plate 203 representative of the multi-layer ceramic plate 160 of FIG. 1). The electrostatic wafer chuck 200 may include an aluminum body 204. Three positions of a temperature probe (e.g., temperature probe 206, temperature probe 208, temperature probe 210) are shown. The temperature probe 206 is shown as being positioned to sense the temperature below a heater 212 (e.g., including the heat spreader 152 and the inner dielectric layer 154 of FIG. 1) of the multi-layer ceramic plate 203. The temperature probe 208 is shown as being positioned to sense the temperature below the electrode layer 404. The temperature probe 210 is shown as being positioned to sense the temperature at the wafer 202 surface (e.g., the temperature probe 210 may have a direct line of sight to the wafer 202 with no material in between them). The temperature probe 208 and the temperature probe 210 may offer improved temperature measurements compared to the temperature probe 208.

Still referring to FIG. 2, the aluminum body 204 may include multiple cooling fluid channels (e.g., cooling fluid channel 220, cooling fluid channel 222, cooling fluid channel 224).

Figure 3:
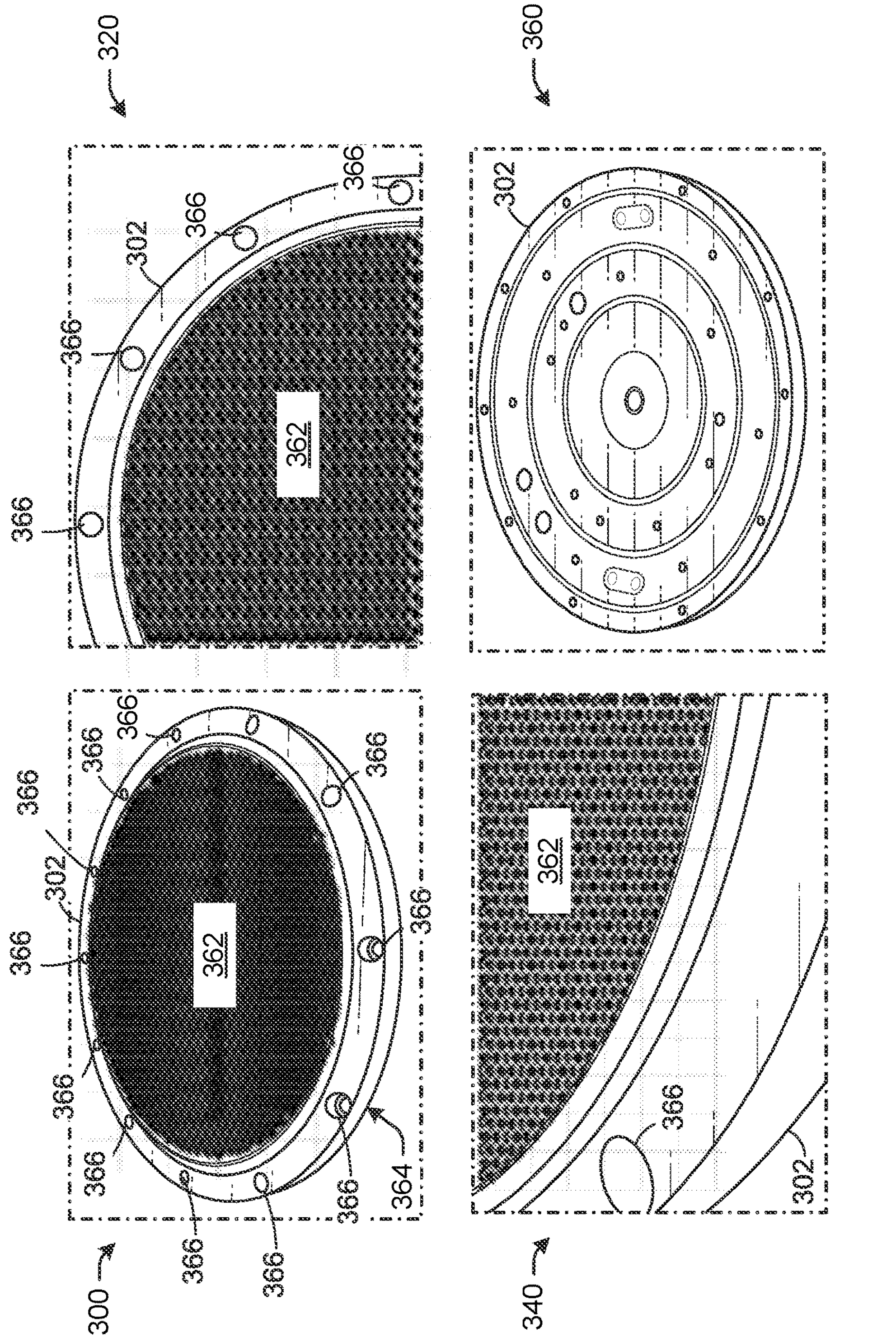
FIG. 3 illustrates example portions of an electrostatic wafer chuck, in accordance with one or more example embodiments of the present disclosure.

FIG. 3 illustrates example portions of an electrostatic wafer chuck, in accordance with one or more example embodiments of the present disclosure.

Referring to FIG. 3, a top side 300 of an electrostatic wafer chuck 302 is shown, along with a portion 320 of the electrostatic wafer chuck, an edge view 340 of the electrostatic wafer chuck 302, and a bottom side 360 of the electrostatic wafer chuck 302. As shown, the top surface 362 of the electrostatic wafer chuck 302 may be bonded to an aluminum base 364, which may be spray coated with a ceramic coating and may have mounting holes 366 to attach the electrostatic wafer chuck 302 inside an etching chamber, for example. The bottom side 360 has connections and features to allow cooling, heating, and direct current and radio frequency biasing connections.

Figure 4:
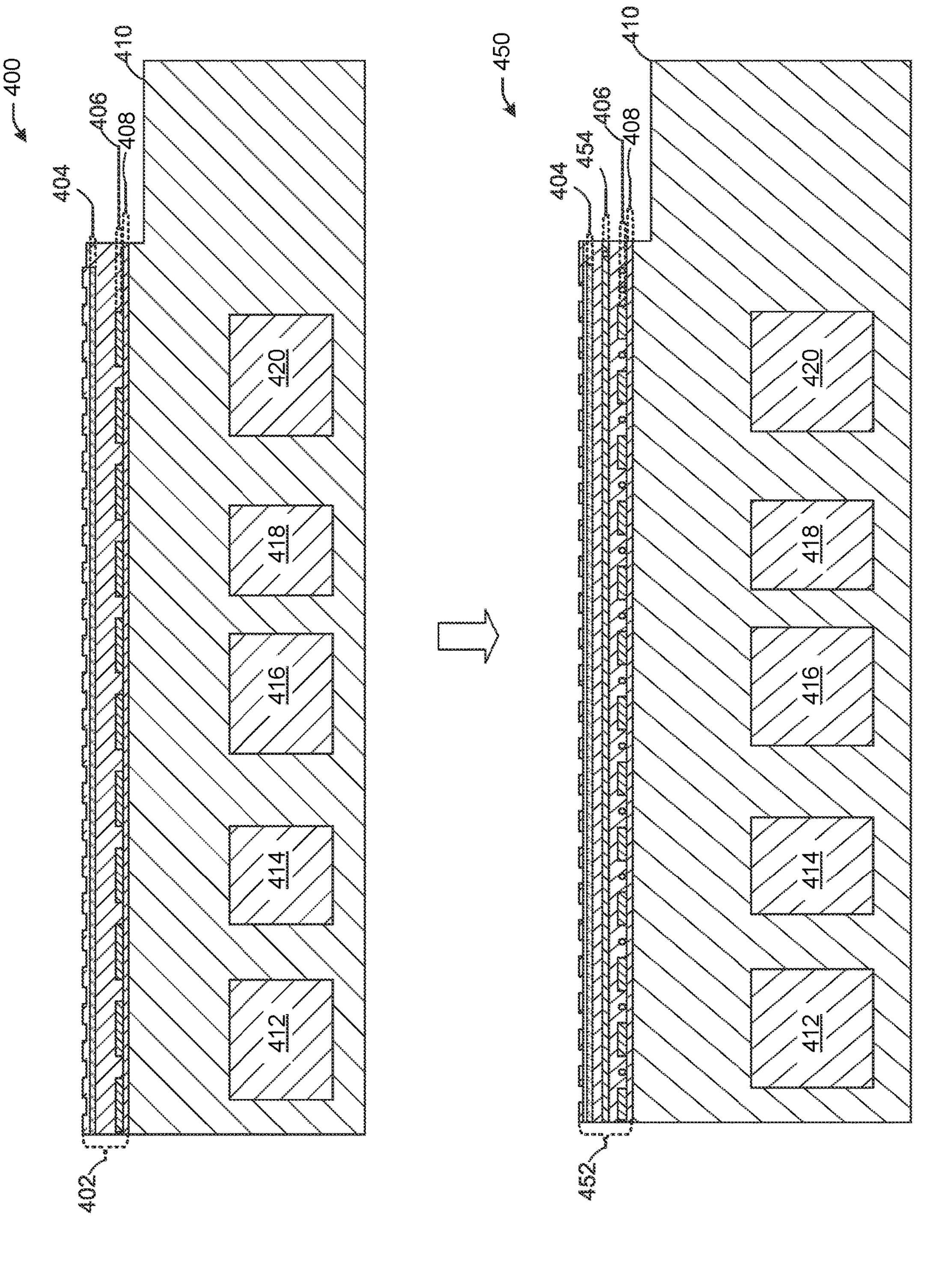
FIG. 4 illustrates example cross-sections of electrostatic wafer chuck with internal heaters for electrostatic wafer chucks, in accordance with one or more example embodiments of the present disclosure.

FIG. 4 illustrates example cross-sections of electrostatic wafer chucks with internal heaters for electrostatic wafer chucks, in accordance with one or more example embodiments of the present disclosure.

Referring to FIG. 4, an electrostatic wafer chuck 400 may include a multi-layer ceramic plate 402 having an electrode layer 404 (e.g., the electrode 112 of FIG. 1), a heater layer 406 (e.g., the heater 108 of FIG. 1), and a bonding layer 408 (e.g., the bonding layer 104 of FIG. 1). The electrode layer 404 may provide an electrostatic force with which to hold the wafer 202 of FIG. 2, for example. An aluminum body 410 may include multiple cooling fluid channels (e.g., cooling fluid channel 412, cooling fluid channel 414, cooling fluid channel 416, cooling fluid channel 418, cooling fluid channel 420).

Still referring to FIG. 4, an electrostatic wafer chuck 450 may include the electrode layer 404, the heater layer 406, and the bonding layer 408 in a multi-layer ceramic plate 452. The multi-layer ceramic plate 452 also may include a heat spreader 454 (e.g., the heat spreader 152 and the inner dielectric layer 154 of FIG. 1).

Figure 5:
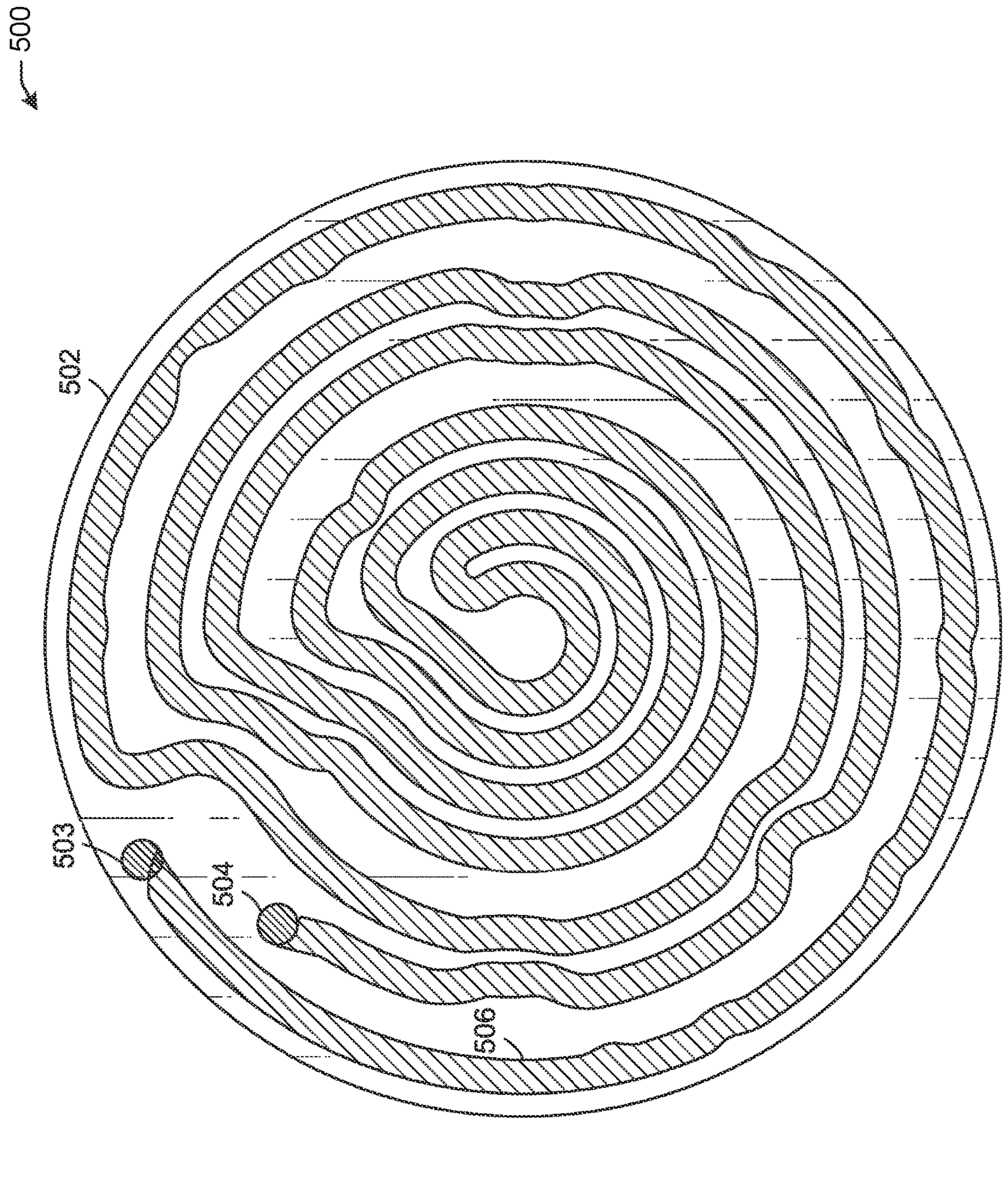
FIG. 5 illustrates an example ultrasonic image of an internal cooling channel of an electrostatic wafer chuck, in accordance with one or more example embodiments of the present disclosure.

FIG. 5 illustrates an example ultrasonic image 500 of an internal cooling channel of an electrostatic wafer chuck 502, in accordance with one or more example embodiments of the present disclosure.

Referring to FIG. 5, the electrostatic wafer chuck 502 may include a cooling fluid inlet 503 and a cooling fluid outlet 504 (e.g., forming a cooling fluid channel 506 as shown in FIGS. 2 and 4).

Figure 6:
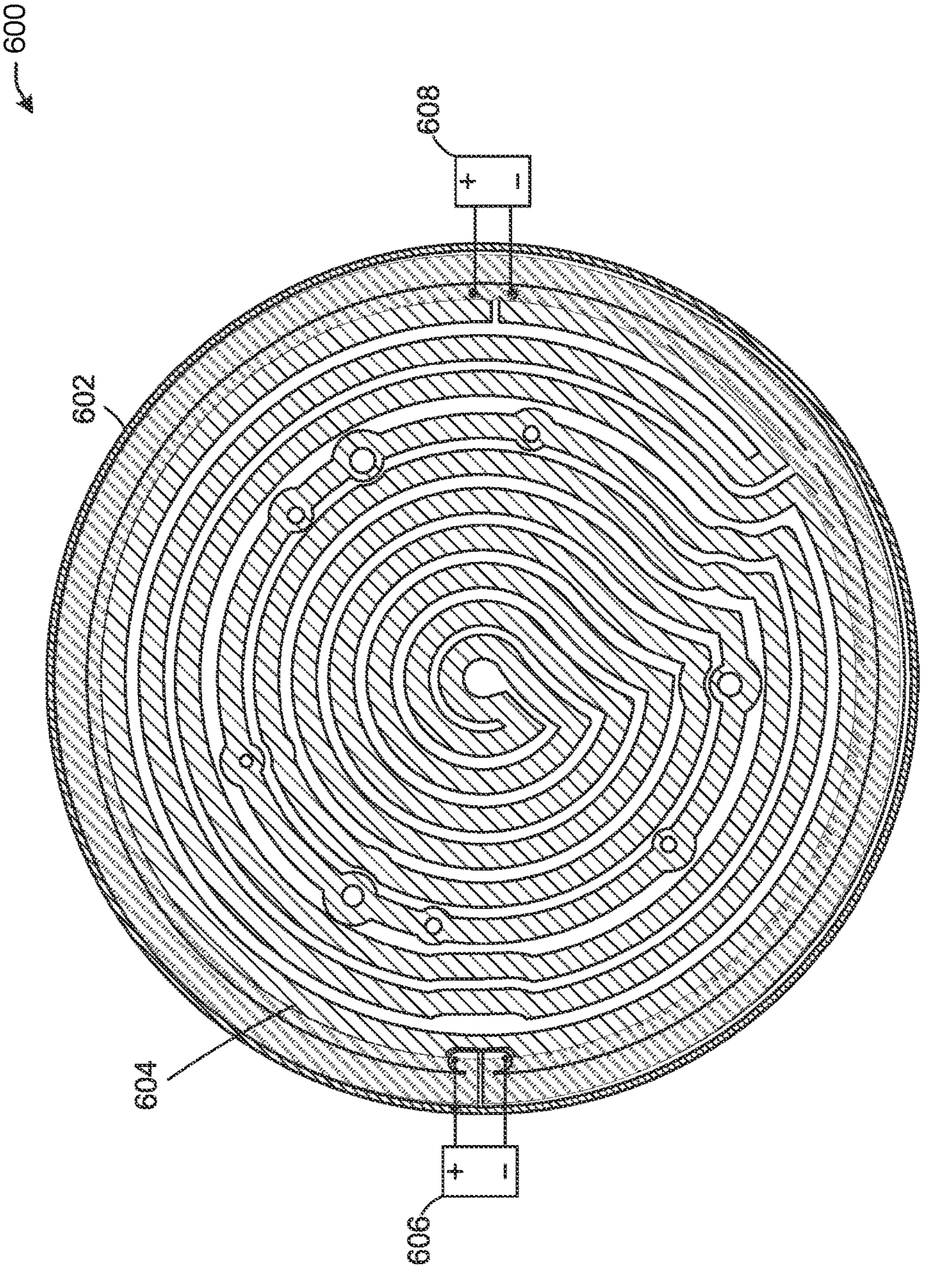
FIG. 6 illustrates an electrostatic wafer chuck heater metallization layer, in accordance with one or more example embodiments of the present disclosure.

FIG. 6 illustrates an electrostatic wafer chuck 600 heater metallization layer 602, in accordance with one or more example embodiments of the present disclosure.

Referring to FIG. 6, the electrostatic wafer chuck 600 may include metallic traces 604 and a two-heater zone design (e.g., a narrower outer zone 606 and a larger inner zone 608). As shown the metallic traces 604 (e.g., used for heating) may route around features such as holes, terminals, and the like.

Figure 7:
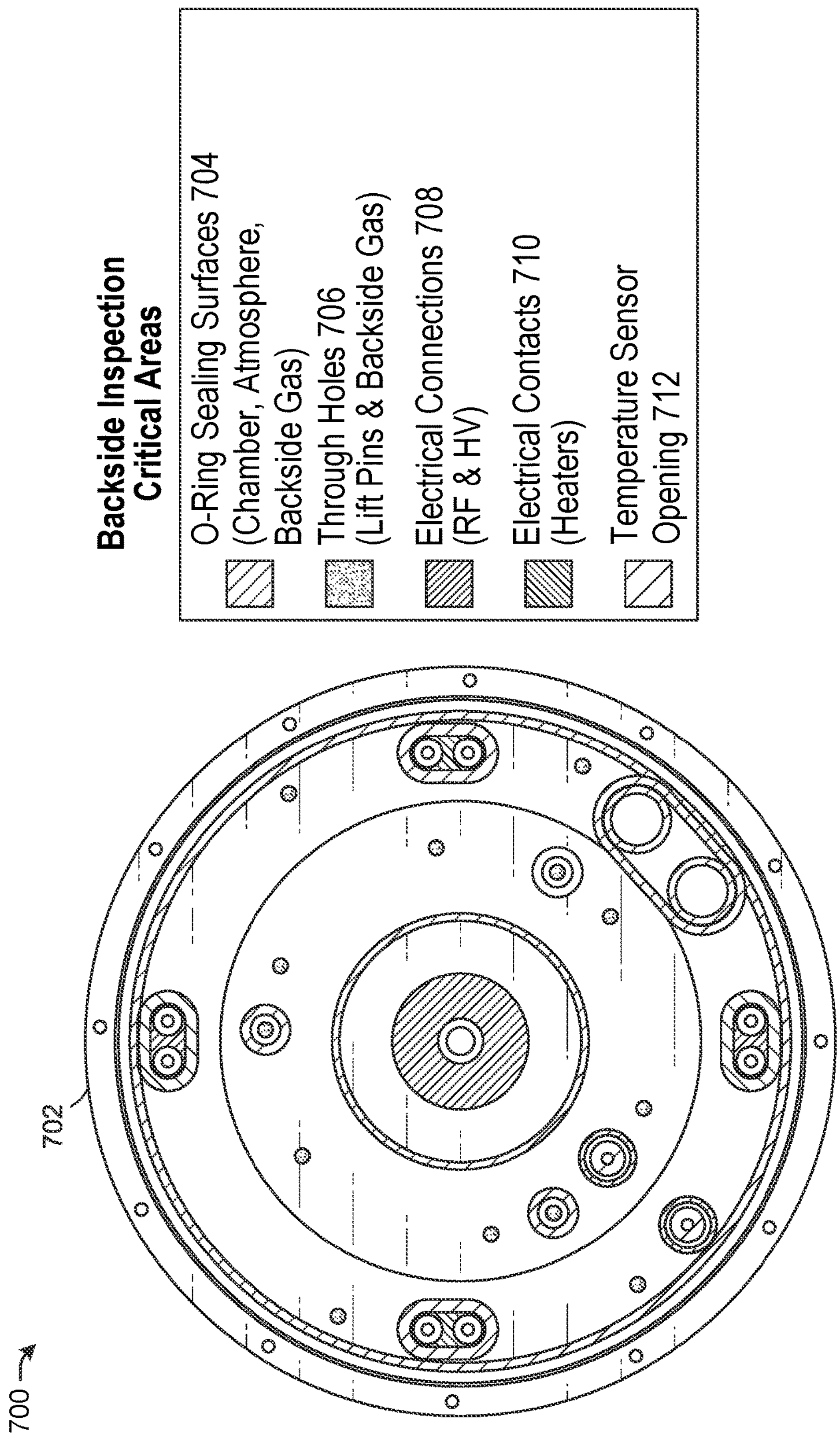
FIG. 7 illustrates an example backside of an electrostatic wafer chuck, in accordance with one or more example embodiments of the present disclosure.

FIG. 7 illustrates an example backside of an electrostatic wafer chuck 702, in accordance with one or more example embodiments of the present disclosure.

Referring to FIG. 7, the backside of an electrostatic wafer chuck 702 may include O-ring surfaces 704 (e.g., for chambers, atmosphere, backside gas, etc.), through holes 706 (e.g., for wafer lift pins and backside gas), an electrical connections area 708 (e.g., for the radiofrequency and high voltage), gold electrical contacts 710 (or another material for heaters), and temperature sensor pad openings 712 (e.g., thermocouple, Fluoroptic, infra-red).

Figure 8:
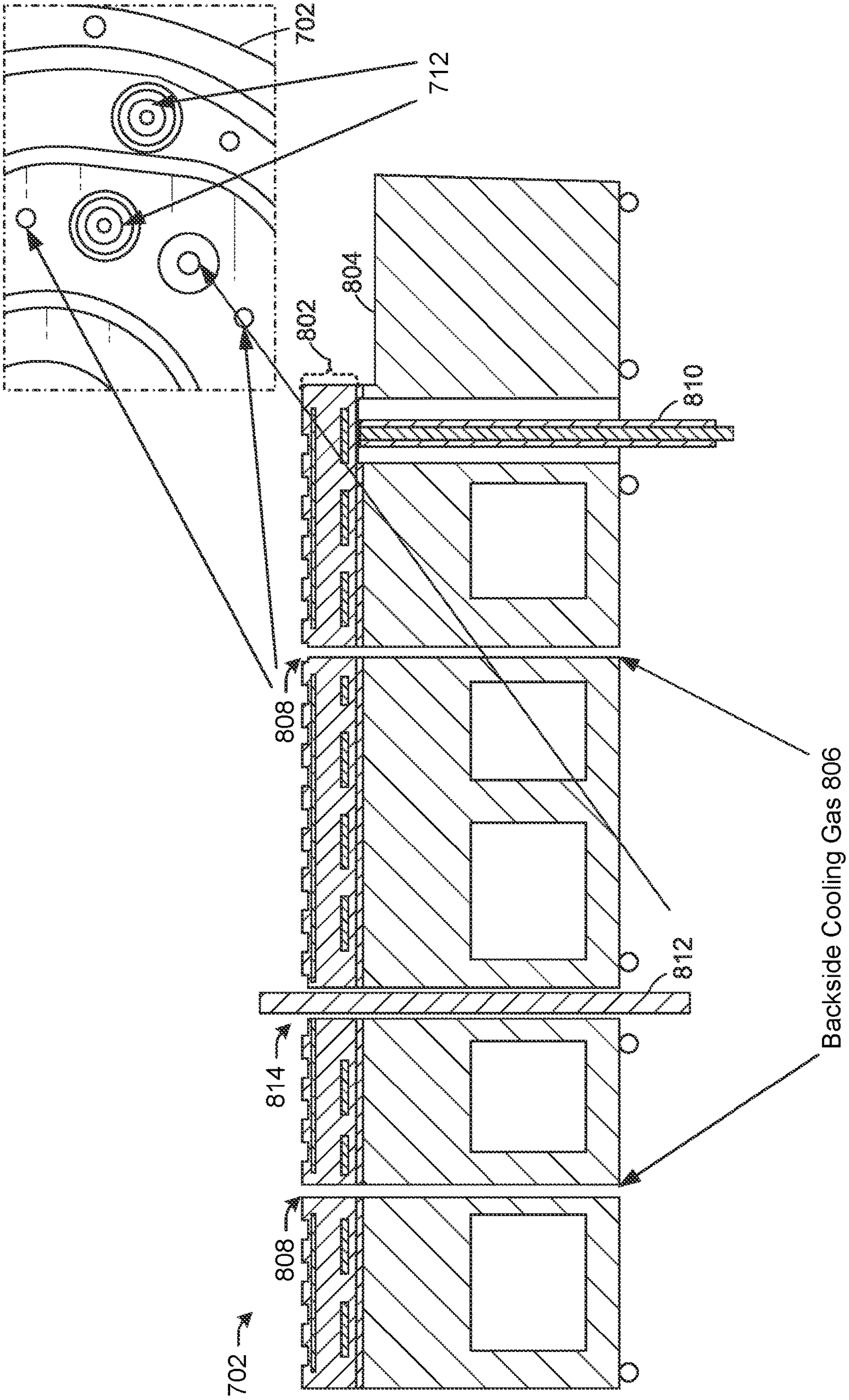
FIG. 8 illustrates an example cross-section of the electrostatic wafer chuck of FIG. 7, in accordance with one or more example embodiments of the present disclosure.

FIG. 8 illustrates an example cross-section of the electrostatic wafer chuck 702 of FIG. 7, in accordance with one or more example embodiments of the present disclosure.

Referring to FIG. 8, the electrostatic wafer chuck 702 may include a multi-layer ceramic plate 802 (e.g., having the heat spreader 152 of FIG. 1), and an aluminum body 804. Backside cooling gas 806 (e.g., to cool the backside of the electrostatic wafer chuck 702 shown in FIG. 7) may pass through holes 808 (e.g., apertures extending through the aluminum body 804 and through the multi-layer ceramic plate 802). The holes 808 are shown in their corresponding location of the backside of the electrostatic wafer chuck 702, along with the temperature sensor pad openings 712). A temperature sensing probe 810 (e.g., of an optical probe) may be positioned to have a direct line of sight with the multi-layer ceramic plate 802. A wafer lift pin 812 may be positioned through a corresponding hole 814 (e.g., corresponding to the holes 706 shown in FIG. 7) extending through the aluminum body 804 and through the multi-layer ceramic plate 802.

Figure 9:
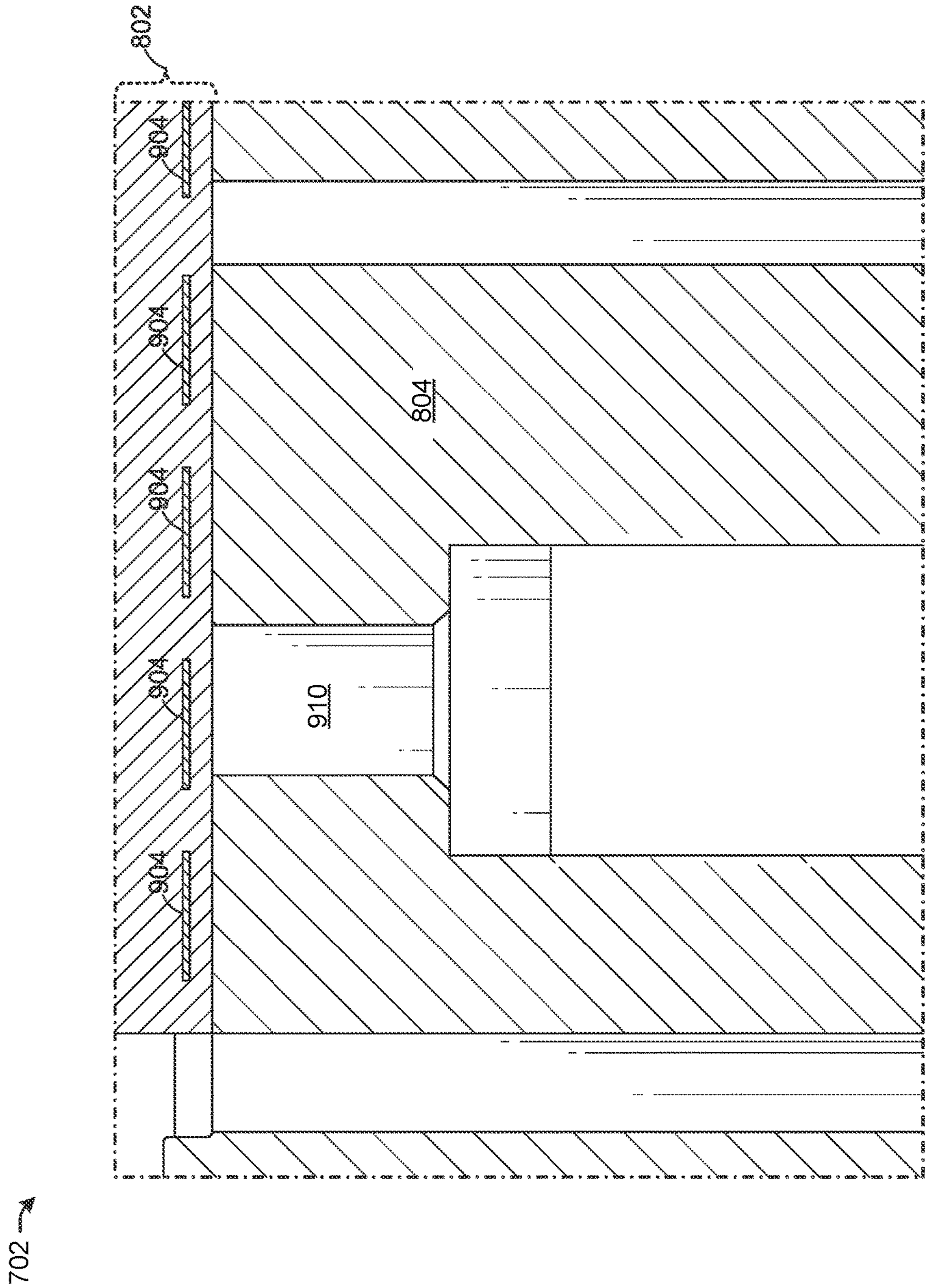
FIG. 9 illustrates an example cross-section of the electrostatic wafer chuck of FIG. 7 at a temperature sensing pad, in accordance with one or more example embodiments of the present disclosure.

FIG. 9 illustrates an example cross-section of the electrostatic wafer chuck 702 of FIG. 7 at a temperature sensing pad (e.g., the temperature sensing probe 810 of FIG. 8), in accordance with one or more example embodiments of the present disclosure.

As shown in FIG. 9, the temperature sensing probe 810 may extend through the aluminum body 804 and have a direct line of sight to the multi-layer ceramic plate 802, which may include heater metallization 904 (e.g., the heat spreader 152 and the inner dielectric layer 154 of FIG. 1). The temperature measurement sensed by the temperature sensing probe 810 (e.g., a fluoroptic probe) may be used to set a set point temperature for the electrostatic wafer chuck 702 of FIG. 7. By positioning a temperature sensor opening 910 (e.g., for the temperature sensing probe 810) proximal to and in direct line of sight to the multi-layer ceramic plate 802, heat sensing and control of the electrostatic wafer chuck 702 may be improved. By integrating the heater metallization 904 into the multi-layer ceramic plate 802, temperature distribution may be improved by more evenly distributing heat across a wafer (e.g., the wafer 202 of FIG. 2) when held electrostatically by the electrostatic wafer chuck 702.

Figure 10:
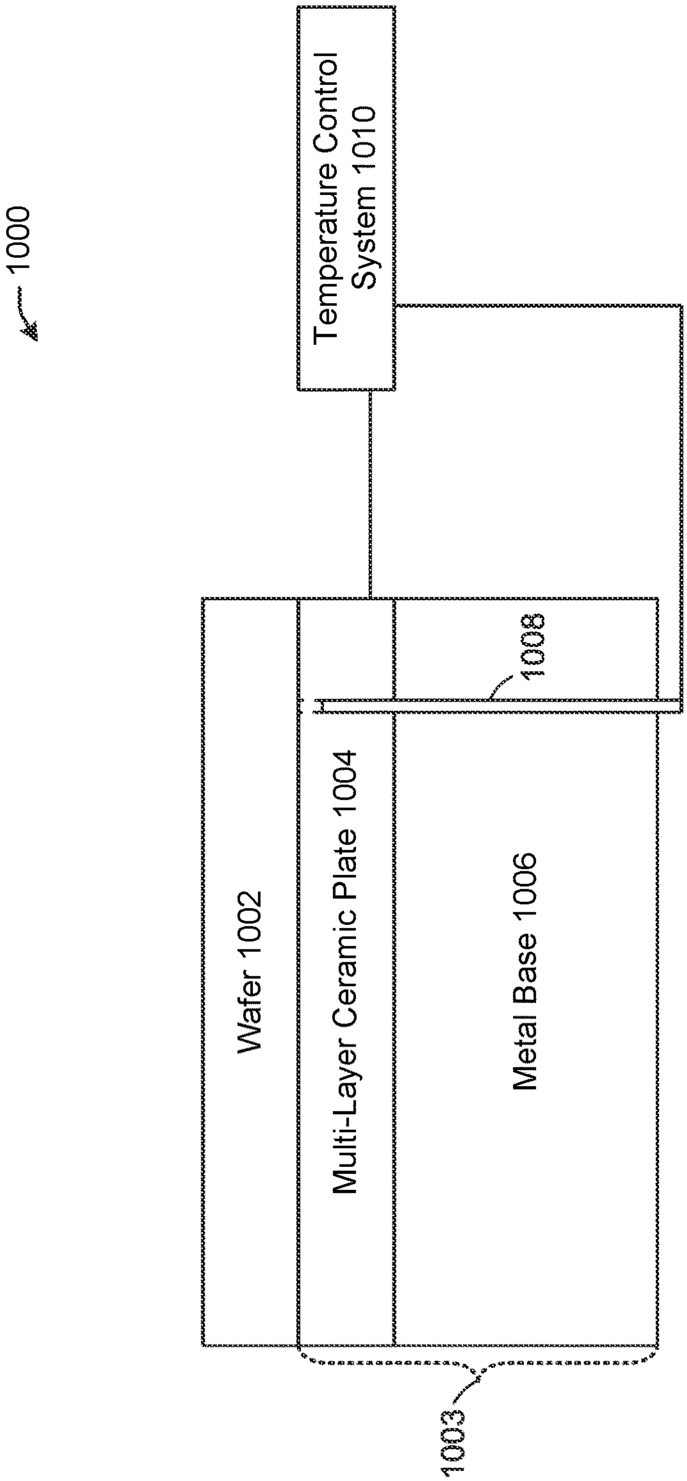
FIG. 10 illustrates a schematic diagram of a system using an electrostatic wafer chuck, in accordance with one or more example embodiments of the present disclosure.

FIG. 10 illustrates a schematic diagram of a system 1000 using an electrostatic wafer chuck, in accordance with one or more example embodiments of the present disclosure.

Referring to FIG. 10, the system 1000 may include a wafer 1002 held electrostatically by an electrostatic wafer chuck 1003 including a multi-layer ceramic plate 1004 (e.g., corresponding to the multi-layer ceramic plate 160 of FIG. 1) and a metal base 1006. A temperature sensor 1008 (e.g., a fluoroptic probe or another type of optical probe) may extend through the metal base 1006 and at least partially through the multi-layer ceramic plate 1004 (e.g., optionally extending through the multi-layer ceramic plate 1004 to have a direct line of sight with the wafer 1002). Temperatures sensed by the temperature sensor 1008 may be provided to a temperature control system 1010, which may use the sensed temperatures to set the set point temperature of the multi-layer ceramic plate 1004 (e.g., the heater 108 of FIG. 1).

It is understood that the above descriptions are for purposes of illustration and are not meant to be limiting.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The word "exemplary" is used herein to mean "serving as an example, instance, or illustration." Any embodiment described herein as "exemplary" is not necessarily to be construed as preferred or advantageous over other embodiments.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

The following examples pertain to further embodiments.

Example 1 may include an electrostatic wafer chuck for holding and heating semiconductor wafers, the electrostatic wafer chuck comprising: a metal base; a temperature sensor; and a multi-layer ceramic plate comprising: a bonding layer; a heater; a first dielectric positioned between the heater and the bonding layer; an electrode configured to electrostatically hold a semiconductor wafer; a second dielectric positioned between the heater and the electrode; a heat spreader configured to uniformly distribute heat from the heater to the semiconductor wafer; and a third dielectric positioned between the electrode and the semiconductor wafer.

Example 2 may include the electrostatic wafer chuck of example 1 and/or any other example herein, wherein the temperature sensor extends through the metal base and only partially through the multi-layer ceramic plate.

Example 3 may include the electrostatic wafer chuck of example 2 and/or any other example herein, wherein the temperature sensor extends through the multi-layer ceramic plate and has a direct line of sight to the semiconductor wafer.

Example 4 may include the electrostatic wafer chuck of example 1 and/or any other example herein, wherein the temperature sensor is a fluoroptic temperature probe.

Example 5 may include the electrostatic wafer chuck of example 1 and/or any other example herein, wherein the heat spreader is positioned between the heater and the electrode.

Example 6 may include the electrostatic wafer chuck of example 5 and/or any other example herein, wherein the heat spreader is positioned between the second dielectric and a fourth dielectric between the heat spreader and the electrode.

Example 7 may include the electrostatic wafer chuck of example 6 and/or any other example herein, wherein the second dielectric is positioned adjacent to the heater and the heat spreader, and wherein the fourth dielectric is positioned adjacent to the heat spreader and the electrode.

Example 8 may include an electrostatic wafer chuck for holding and heating semiconductor wafers, the electrostatic wafer chuck comprising: a metal base; a temperature sensor extending through the metal base and into a multi-layer ceramic plate; and the multi-layer ceramic plate, comprising: a bonding layer; a heater; a first dielectric positioned between the heater and the bonding layer; an electrode configured to electrostatically hold a semiconductor wafer; a second dielectric positioned between the heater and the electrode; a heat spreader configured to uniformly distribute heat from the heater to the semiconductor wafer; and a third dielectric positioned between the electrode and the semiconductor wafer.

Example 9 may include the electrostatic wafer chuck of example 8 and/or any other example herein, wherein the temperature sensor extends only partially through the multi-layer ceramic plate.

Example 10 may include the electrostatic wafer chuck of example 8 and/or any other example herein, wherein the temperature sensor extends through the multi-layer ceramic plate and has a direct line of sight to the semiconductor wafer.

Example 11 may include the electrostatic wafer chuck of example 8 and/or any other example herein, wherein the temperature sensor is a fluoroptic temperature probe.

Example 12 may include the electrostatic wafer chuck of example 8 and/or any other example herein, wherein the heat spreader is positioned between the heater and the electrode.

Example 13 may include the electrostatic wafer chuck of example 12 and/or any other example herein, wherein the heat spreader is positioned between the second dielectric and a fourth dielectric between the heat spreader and the electrode.

Example 14 may include the electrostatic wafer chuck of example 13 and/or any other example herein, wherein the second dielectric is positioned adjacent to the heater and the heat spreader, and wherein the fourth dielectric is positioned adjacent to the heat spreader and the electrode.

Example 15 may include a system for holding and heating semiconductor wafers, the system comprising: an electrostatic wafer chuck operatively connected to a temperature control system, the electrostatic wafer chuck comprising: a metal base; a temperature sensor; and a multi-layer ceramic plate comprising: a bonding layer; a heater; a first dielectric positioned between the heater and the bonding layer; an electrode configured to electrostatically hold a semiconductor wafer; a second dielectric positioned between the heater and the electrode; a heat spreader configured to uniformly distribute heat from the heater to the semiconductor wafer; and a third dielectric positioned between the electrode and the semiconductor wafer.

Example 16 may include the system of example 15 and/or any other example herein, wherein the temperature sensor extends through the metal base and through only partially through the multi-layer ceramic plate.

Example 17 may include the system of example 16 and/or any other example herein, wherein the temperature sensor extends through the multi-layer ceramic plate and has a direct line of sight to the semiconductor wafer.

Example 18 may include the system of example 15 and/or any other example herein, wherein the temperature sensor is a fluoroptic temperature probe.

Example 19 may include the system of example 15 and/or any other example herein, wherein the heat spreader is positioned between the heater and the electrode.

Example 20 may include the system of example 19 and/or any other example herein, wherein the heat spreader is electrically conductive, wherein the heat spreader and the electrode are a same layer positioned between the heater and the wafer.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. An electrostatic wafer chuck for holding and heating semiconductor wafers, the electrostatic wafer chuck comprising:
- a metal base;
- a temperature sensor; and
- a multi-layer ceramic plate comprising:
  - a bonding layer;
  - a heater;
  - a first dielectric positioned between the heater and the bonding layer;
  - an electrode configured to electrostatically hold a semiconductor wafer;
  - a second dielectric positioned between the heater and the electrode;
  - a heat spreader configured to uniformly distribute heat from the heater to the semiconductor wafer; and
  - a third dielectric positioned between the electrode and the semiconductor wafer, wherein the temperature sensor extends through the metal base and through the multi-layer ceramic plate to have a direct line of sight to the semiconductor wafer.

2. The electrostatic wafer chuck of claim 1, wherein the temperature sensor extends through the metal base and only partially through the multi-layer ceramic plate.

3. The electrostatic wafer chuck of claim 1, wherein the temperature sensor is a fluoroptic temperature probe.

4. The electrostatic wafer chuck of claim 1, wherein the heat spreader is positioned between the heater and the electrode.

5. The electrostatic wafer chuck of claim 4, wherein the heat spreader is positioned between the second dielectric and a fourth dielectric between the heat spreader and the electrode.

6. The electrostatic wafer chuck of claim 5, wherein the second dielectric is positioned adjacent to the heater and the heat spreader, and wherein the fourth dielectric is positioned adjacent to the heat spreader and the electrode.

7. An electrostatic wafer chuck for holding and heating semiconductor wafers, the electrostatic wafer chuck comprising:
- a metal base;
- a temperature sensor extending through the metal base and through the multi-layer ceramic plate to have a direct line of sight to the semiconductor wafer; and
- the multi-layer ceramic plate, comprising:
  - a bonding layer;
  - a heater;
  - a first dielectric positioned between the heater and the bonding layer;
  - an electrode configured to electrostatically hold a semiconductor wafer;
  - a second dielectric positioned between the heater and the electrode;
  - a heat spreader configured to uniformly distribute heat from the heater to the semiconductor wafer; and
  - a third dielectric positioned between the electrode and the semiconductor wafer.

8. The electrostatic wafer chuck of claim 7, wherein the temperature sensor extends only partially through the multi-layer ceramic plate.

9. The electrostatic wafer chuck of claim 7, wherein the temperature sensor is a fluoroptic temperature probe.

10. The electrostatic wafer chuck of claim 7, wherein the heat spreader is positioned between the heater and the electrode.

11. The electrostatic wafer chuck of claim 10, wherein the heat spreader is positioned between the second dielectric and a fourth dielectric between the heat spreader and the electrode.

12. The electrostatic wafer chuck of claim 11, wherein the second dielectric is positioned adjacent to the heater and the heat spreader, and wherein the fourth dielectric is positioned adjacent to the heat spreader and the electrode.

13. A system for holding and heating semiconductor wafers, the system comprising:
- an electrostatic wafer chuck operatively connected to a temperature control system, the electrostatic wafer chuck comprising:
  - a metal base;
  - a temperature sensor; and
  - a multi-layer ceramic plate comprising:
    - a bonding layer;
    - a heater;
    - a first dielectric positioned between the heater and the bonding layer;

an electrode configured to electrostatically hold a semiconductor wafer;

a second dielectric positioned between the heater and the electrode;

a heat spreader configured to uniformly distribute heat from the heater to the semiconductor wafer; and a third dielectric positioned between the electrode and the semiconductor wafer, wherein the temperature sensor extends through the metal base and through the multi-layer ceramic plate to have a direct line of sight to the semiconductor wafer.

14. The system of claim 13, wherein the temperature sensor extends through the metal base and only partially through the multi-layer ceramic plate.

15. The system of claim 13, wherein the temperature sensor is a fluoroptic temperature probe.

16. The system of claim 13, wherein the heat spreader is positioned between the heater and the electrode.

17. The system of claim 13, wherein the heat spreader is electrically conductive, wherein the heat spreader and the electrode are a same layer positioned between the heater and the wafer.

* * * * *